(12) United States Patent
Utsunomiya et al.

(10) Patent No.: US 7,342,354 B2
(45) Date of Patent: Mar. 11, 2008

(54) ORGANIC EL DISPLAY DEVICE, ELECTRONIC EQUIPMENT, AND METHOD FOR MANUFACTURING THE SAME

(75) Inventors: Sumio Utsunomiya, Suwa (JP); Tomoyuki Kamakura, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/850,423

(22) Filed: May 21, 2004

(65) Prior Publication Data
US 2004/0245924 A1    Dec. 9, 2004

(30) Foreign Application Priority Data
May 23, 2003    (JP)    ............... 2003-146142

(51) Int. Cl.
*H05B 33/00* (2006.01)
(52) U.S. Cl. ...................... 313/503; 313/506
(58) Field of Classification Search ........ 313/498–512; 428/690, 917; 257/59, 347, 72; 445/24, 445/25
See application file for complete search history.

(56) References Cited

U.S. PATENT DOCUMENTS

| | | | | |
|---|---|---|---|---|
| 6,201,346 | B1* | 3/2001 | Kusaka | 313/504 |
| 6,682,990 | B1* | 1/2004 | Iwane et al. | 438/458 |
| 7,040,741 | B2 | 5/2006 | Nakamura et al. | |
| 2001/0004190 | A1* | 6/2001 | Nishi et al. | 313/506 |
| 2001/0017517 | A1* | 8/2001 | Yamazaki | 313/504 |
| 2002/0030440 | A1* | 3/2002 | Yamazaki | 313/503 |
| 2002/0030770 | A1 | 3/2002 | Tsutsui et al. | |
| 2002/0070662 | A1* | 6/2002 | Moriyama et al. | 313/504 |
| 2003/0174275 | A1 | 9/2003 | Asano et al. | |

FOREIGN PATENT DOCUMENTS

| | | |
|---|---|---|
| EP | 0 858 110 A1 | 8/1998 |
| EP | 1 122 794 A2 | 8/2001 |
| JP | A 2000-133809 | 5/2000 |
| JP | A 2001-51296 | 2/2001 |
| JP | A-2001-331120 | 11/2001 |
| JP | A 2002-217391 | 8/2002 |
| JP | A-2003-31778 | 1/2003 |
| JP | A-2003-100450 | 4/2003 |
| JP | A 2003-127405 | 5/2003 |
| WO | WO 02/084739 A1 | 10/2002 |

* cited by examiner

*Primary Examiner*—Joseph Williams
(74) *Attorney, Agent, or Firm*—Oliff & Berridge, PLC (57) ABSTRACT

To provide a sheet-shaped organic EL display device having a reduced thickness, an organic EL display device includes a substrate serving as both a protective layer to reduce or prevent permeation of moisture, oxygen, and the like into the inside and a support layer for film formation, a laminate which is provided on a under layer by film formation and which includes a thin film circuit layer carrying an electric circuit and an organic EL light emitting layer carrying an organic EL light emitting element, and an adhesive layer joining the above-described laminate and the above-described substrate. The above-described organic EL light emitting element radiates the emitted light toward the above-described under layer side. In this manner, a low-profile organic EL display device can be provided.

8 Claims, 6 Drawing Sheets

ORGANIC EL DISPLAY DEVICE, ELECTRONIC EQUIPMENT, AND METHOD FOR MANUFACTURING THE SAME

BACKGROUND OF THE INVENTION

1. Field of Invention

The present invention relates to an enhancement of an organic EL display device. In particular, it relates to an organic EL display device which can be prepared with a reduced thickness, electronic equipment including the same, and a method to manufacture the same.

2. Description of Related Art

With respect to related art semiconductor devices and the like, high-temperature treatment is included in the process of manufacturing laminates composed of required microstructures, thin film circuits, and the like on substrates. Therefore selection of elements constituting substrates and laminates may be restricted. For example, resin films, plastic substrates, and the like are not suitable for a high-temperature treatment.

Consequently, for example, as described in Japanese Unexamined Patent Application Publication No. 2002-217391, a thin film circuit is formed on a heat-resistant element-forming substrate with a first release layer therebetween. A temporary transfer substrate is adhered to this thin film circuit with a second release layer therebetween. The first release layer is broken, so that the thin film circuit is transferred from the element-forming substrate side to the temporary transfer substrate side. Furthermore, a final substrate is bonded together with the temporary transfer substrate and, thereafter, the second release layer is broken, so that the thin film circuit is transferred from the temporary transfer substrate side to the final substrate side. In this manner, the thin film circuit is disposed on a plastic substrate through film formation steps in an order similar to that in a case where the thin film circuit is formed on the element-forming substrate. Here, the thin film circuit includes a thin film transistor (TFT) circuit, a TFT circuit substrate of a liquid crystal display, an organic EL display device, and the like.

SUMMARY OF THE INVENTION

However, when the organic EL display device is transferred to the final substrate by repeating the peeling transfer between substrates as many as two times, as described above, the number of manufacturing steps is increased, and the manufacturing process becomes complicated.

An organic EL display device can be formed on a highly flexible plastic thin film substrate by the use of the above-described peeling transfer technology. Accordingly, it is expected that a sheet-shaped thin organic EL display panel will be provided. However, in order to reduce or prevent permeation of gas, such as moisture and oxygen and the like into light emitting elements, the organic EL display device is required to include a sealing substrate to cover and protect a group of light emitting elements, besides the above-described plastic substrate. Consequently, even when a thin plastic substrate is used, there is a certain limit to reduction in the total thickness of the display panel. Furthermore, the light radiated from an organic EL light emitting element located between the two substrates is emitted to the outside through one of the substrate and, thereby, a transmission loss is produced during passage through the substrate.

Accordingly, the present invention provides an organic EL display device in which a transmission loss due to a substrate is reduced.

The present invention also provides a sheet-shaped organic EL display device having a reduced thickness.

The present invention also provides electronic equipment including the above-described organic EL display device.

The present invention also provides a method to manufacture the above-described organic EL display device.

In order to achieve the above, an organic EL display device of an aspect of the present invention includes a substrate serving as both a protective layer to reduce or prevent permeation of gas, such as moisture, oxygen, and the like into the inside and a support layer for film formation; a laminate which is provided on a under layer by film formation and which includes a thin film circuit layer carrying an electric circuit and an organic EL light emitting layer carrying an organic EL light emitting element to radiate the emitted light toward the above-described under layer side; and an adhesive layer joining the above-described laminate and the above-described substrate. The above-described organic EL light emitting element radiates the emitted light toward the above-described under layer side.

By adopting such a configuration, a low-profile organic EL display device including one substrate can be provided. Since the organic EL light can radiate to the outside not through substrate, the loss of the amount of light due to passage through the substrate and multiple reflection at the substrate can be avoided. Furthermore, the substrate, the adhesive layer, and the under layer form protective layers and, thereby, the permeation of moisture and oxygen into the inside of the device can be suppressed.

A connection electrode may be included, which penetrates a part of the above-described under layer so as to be exposed at the bottom surface of the under layer and which connects an external circuit and the above-described electric circuit. In this manner, the connection to the external circuit can be readily performed. Furthermore, a connection terminal can be ensured by even one time of peeling transfer.

The film thickness of the above-described under layer may be out of 400 (blue) to 800 (red) nm. The thickness may be controlled at 300 nm or less. In this manner, occurrence of interference can be avoided when the emitted light (visible light) passes through the under layer.

The above-described substrate may be a plastic substrate. In this manner, a sheet-shaped display device resistant to bending and shock is readily provided. However, a glass substrate may be adopted.

The mutual connection between the above-described connection electrode and the above-described external circuit may be performed through anisotropic conductive materials or an electrically conductive adhesive. In this manner, the connection to the external circuit can be readily performed.

The above-described connection electrode may be formed to become substantially flush with the above-described under layer. In this manner, the handling and the wiring connection can readily be performed Electronic equipment of an aspect of the present invention includes the above-described organic EL display device and, therefore, the display portion can readily be configured to become low-profile. The electronic equipment is, for example, the equipment including the organic EL display device as a display portion. Examples thereof include video cameras, televisions, large screens, cellular phones, personal computers, personal digital assistants (so-called PDAs), and the like.

A method to manufacture an organic EL display device of an aspect of the present invention includes forming a release layer on a first substrate; forming a laminate on the above-described release layer, the laminate including an organic EL light emitting layer which emits light toward the release layer side; joining the above-described first substrate provided with the above-described laminate and a second substrate with an adhesive layer therebetween; and applying energy to the above-described release layer so as to cause peeling, and peeling off the above-described first substrate so as to transfer the above-described laminate to the above-described second substrate side.

A method to manufacture an organic EL display device according to another aspect of the present invention includes forming a release layer on a first substrate; forming a laminate on the above-described release layer, the laminate including an organic EL light emitting layer which emits light toward the release layer side; joining the first substrate provided with the above-described laminate and a second substrate with an adhesive layer therebetween; and removing the above-described first substrate by dissolution so as to transfer the above-described laminate to the above-described second substrate side.

By adopting such a configuration, an organic EL display device having the above-described features can be formed.

Forming a connection electrode exposed at a part of the bottom surface of the above-described laminate may be further included. In this manner, the connection to an external circuit is readily performed.

BRIEF DESCRIPTION OF THE DRAWINGS

FIG. 2(a) to FIG. 2(c) are schematics for explaining a manufacturing process of an organic EL display device in an exemplary embodiment;

FIG. 3(a) to FIG. 3(c) are schematics for explaining the manufacturing process of the organic EL display device in the exemplary embodiment;

DETAILED DESCRIPTION OF EXEMPLARY EMBODIMENTS

The exemplary embodiments of the present invention will be described bellow with reference to the drawings.

An organic EL display device according to an exemplary embodiment has a configuration in which a substrate provided to support a laminate including a TFT circuit layer, an organic EL light emitting layer, and the like doubles as a sealing substrate. Thereby, one of two substrates of an element-forming substrate and a sealing substrate is unnecessary. Consequently, the laminate is formed in order that a connection electrode is exposed at the back side. The resulting laminate is transferred to a final substrate through one transfer described below. The final substrate is used as a support substrate for the laminate and the sealing substrate. The light emitted from the organic EL light emitting layer is output toward the back side of the laminate while a glass substrate and the like do not intervene. The external circuit is connected to the back side of the laminate through the use of the connection electrode.

Figure 1:
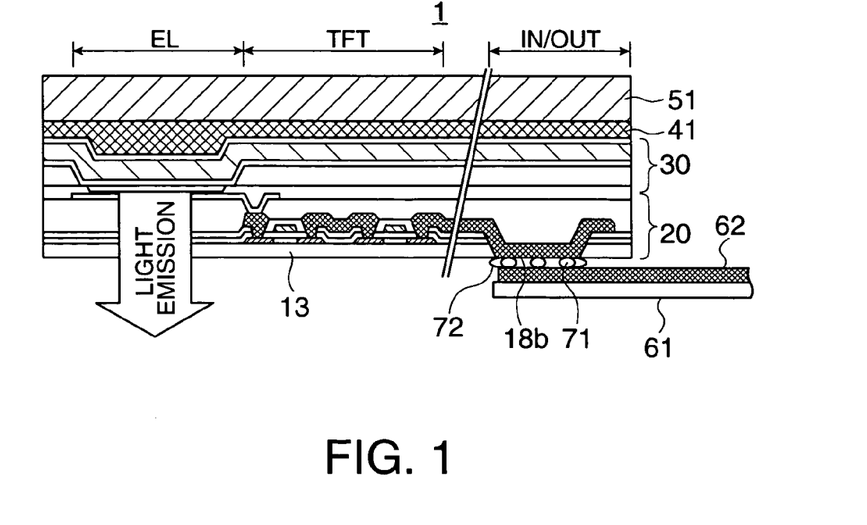
FIG. 1 is a schematic for explaining an exemplary embodiment of an organic EL display device of the present invention.
Figure 2:
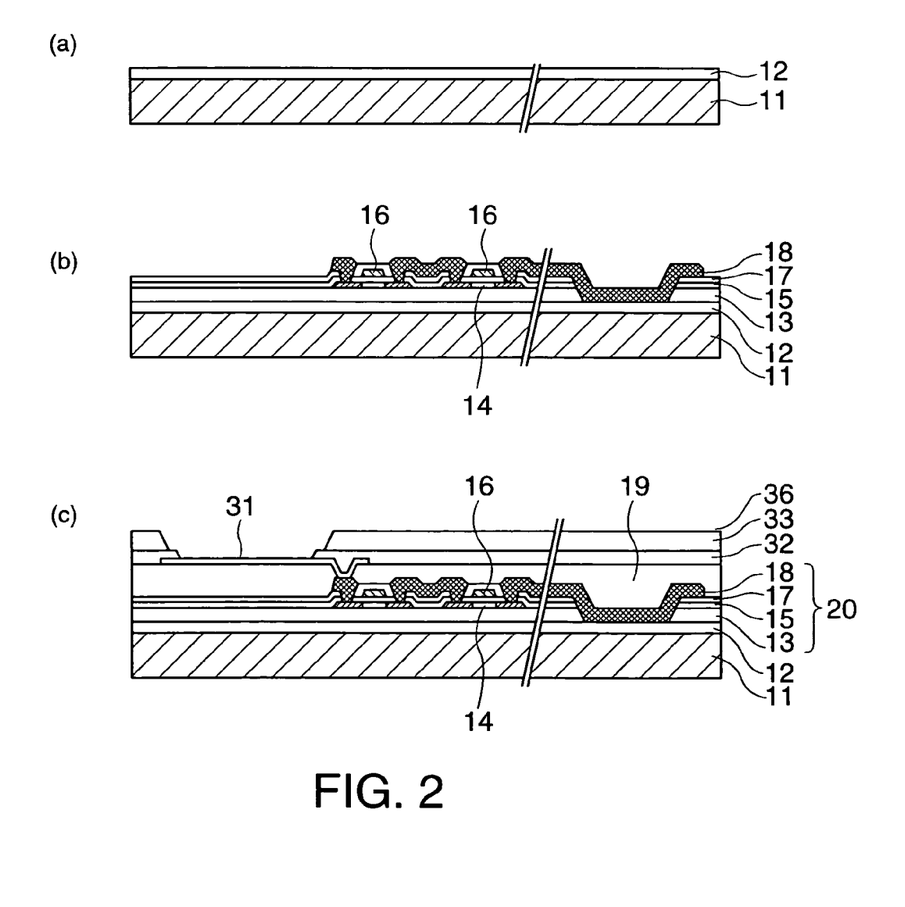
Figure 3:
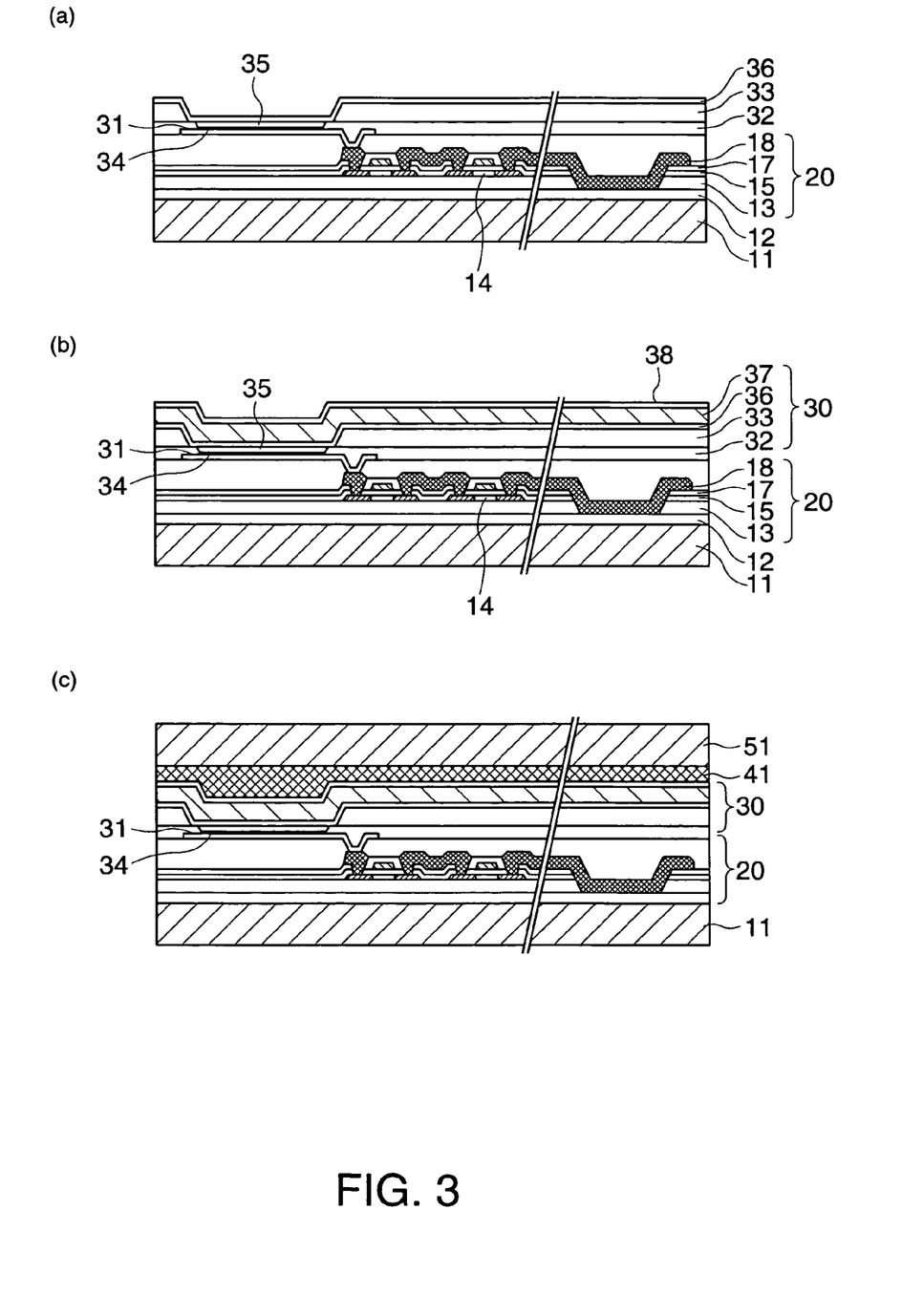

FIG. 1 is a schematic for explaining an organic EL display device according to the present invention.

As shown in FIG. 1, an organic EL display device 1 is provided by joining a laminate including a thin film circuit layer 20 and an organic EL light emitting layer 30 to a substrate 51 with an adhesive 41 therebetween. Only the substrate 51 is used as the substrate. This substrate 51 serves both functions of supporting and protecting (sealing) the laminate. The adhesive 41 doubles as a protective layer and has moisture resistance and airtightness. In addition, a substrate insulating film 13 which is a bottom layer of the thin film circuit layer 20 doubles as a protective layer.

According to this configuration, the emitted light from the organic EL light emitting layer radiates in a downward direction in which a so-called element-forming substrate is not present. Therefore, the amount of light is not reduced due to passage through a substrate. The connection electrode 18b is exposed at the bottom surface of the thin film circuit layer 20 and the preparation can be performed through one peeling transfer, as described below. Therefore, the organic EL display device 1 is allowed to become low-profile compared with that in the case where an element-forming substrate and a protective substrate are used. Thereby, a sheet-shaped organic EL display device can be prepared. Any loss due to passage of the emitted light through a substrate is not produced.

The portion shown in FIG. 1 includes a light emitting element region EL, a thin film transistor (TFT) circuit region TFT, and an external connection region IN/OUT in the organic EL display device 1. An organic EL display element emitting the electroluminescent light (EL) is formed from the organic EL layer 30 in the light emitting element region EL. A transistor circuit to control the action of the organic EL display element is configured by the thin film circuit layer 20 in the thin film transistor circuit region TFT. The thin film circuit layer 20 and the organic EL layer 30 are formed from a laminate composed of laminated plural functional layers, e.g., an insulating layer, an electrically conductive layer, a semiconductor layer, a light emitting layer, and an electrode layer. The connection electrode 18b exposed at the bottom surface of the thin film circuit layer 20 is provided in the external connection region IN/OUT. As described below, the connection electrode 18b is formed to become flush with the bottom surface of a substrate insulating layer. The connection electrode 18b is connected to the inside thin film circuit layer 20 and is connected to a wiring 62 of an FPC substrate (flexible printed circuit substrate) 61 through an adhesive 72 containing anisotropic conductive materials 71. The organic EL display device 1 is supplied with necessary power supply and action signals from the outside through the FPC substrate 61.

The thin film circuit layer 20 is provided by, for example, film formation of a TFT circuit on the substrate insulating layer 13 composed of a silicon oxide film, silicon nitride film, or other insulating substrate. The substrate insulating layer 13 serves a function as a protective layer. In the example shown in the drawing, the substrate insulating layer 13 is composed of one layer, but this may be composed of a plurality of layers. The film thickness of the substrate insulating layer 13 is controlled at out of 400 nm to 800 nm and may be controlled at in the order of 300 nm. Consequently, when the emitted light (visible light) from the organic EL light emitting element passes through the substrate insulating layer 13, occurrence of interference in the substrate insulating layer is avoided because the film thickness of the substrate insulating layer 13 is closely analogous to the wavelength of 400 nm (blue) to 800 nm (red) of the visible light.

Figure 7:
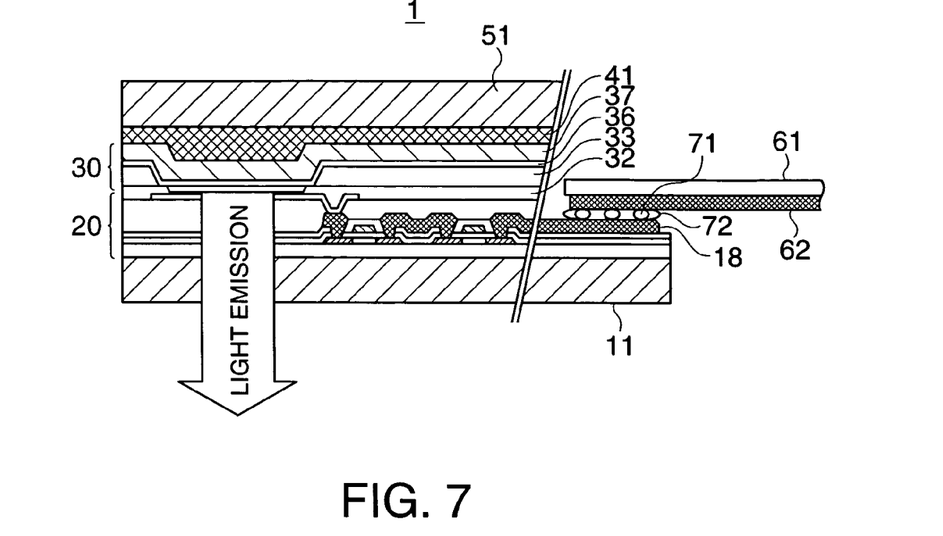
FIG. 7 is a sectional view for explaining an organic EL display device in a comparative example.

FIG. 7 shows a comparative example in order to clarify the features of the example. In FIG. 7, the portions corresponding to those in FIG. 1 are indicated by the same reference numerals as in FIG. 1, and explanations thereof will not be provided.

In the configuration of the comparative example, a thin film circuit layer 20 and an organic EL light emitting layer 30 are provided on an element-forming substrate 11, and a sealing substrate 51 is bonded together with an adhesive 41 therebetween. The thin film circuit layer 20 and the organic EL light emitting layer 30 are supported by the element-forming substrate 11 and, in addition, are sealed by the element-forming substrate 11 and the sealing substrate 51, so that permeation of moisture, oxygen, and the like is reduced or prevented. The perimeter of the substrates are sealed with an adhesive (curable resin), and the connection to an external circuit is performed in the perimeter portion of the substrate 11 through an FPC substrate 61.

As is clear from comparison with the comparative example, since the element-forming substrate 11 is not used in the configuration of the present example shown in FIG. 1, the thickness of the organic EL display device can be reduced. The attenuation of the amount of light and the diffuse reflection in the element-forming substrate 11 can be avoided. Since highly flexible materials, e.g., plastic, can be used as the substrate 51, the organic EL display device can readily be used for various types of electronic equipment.

Figure 8:
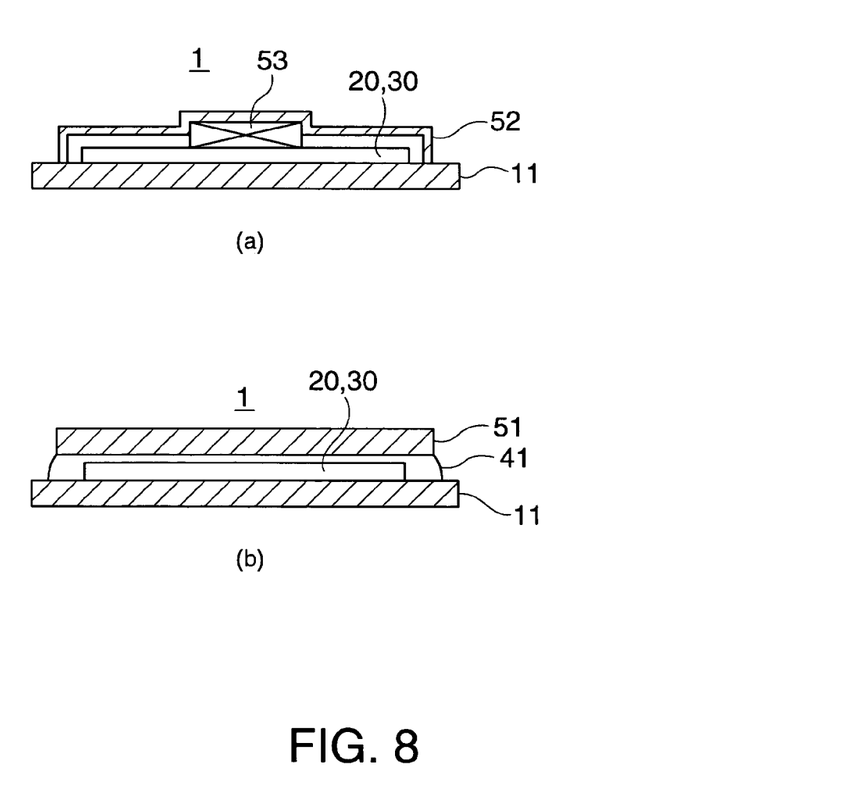
FIG. 8(a) and FIG. 8(b) are schematics for explaining sealing types of an organic EL display device.

FIG. 8 shows an example of a configuration to extend the life time by reducing or preventing permeation of moisture and oxygen into an organic EL display device.

FIG. 8(a) shows a can sealing type. In this type, a laminate composed of a thin film circuit layer 20, an organic EL layer 30, and the like provided on an element-forming substrate 11 is sealed by a can package 52 made of a metal, e.g., stainless steel, and a moisture absorbing agent 53, e.g., calcium oxide (CaO), is disposed in the inside. The moisture which permeates into the inside is absorbed by the moisture absorbing agent 53. Thereby, deterioration of a calcium layer 36 in the organic EL layer 30 due to the moisture is reduced or prevented.

FIG. 8(b) shows a substrate sealing type. This type is similar to that shown in FIG. 7. A laminate composed of a thin film circuit layer 20, an organic EL layer 30, and the like is sandwiched between an element-forming substrate 11 and a sealing substrate 51, the perimeters of both the substrates are sealed by a resin 41. Thereby, permeation of moisture and oxygen into the inside is reduced or prevented.

The configuration of the example of an aspect of the present invention is superior to any type in points of reduction in film thickness of the organic EL display device and reduction in loss of the light passing through the substrate.

FIG. 2 to FIG. 5 are schematics for explaining a manufacturing process in which an organic EL display device is manufactured by a method to transfer a thin film structure.

As shown in FIG. 2(a), a film of amorphous silicon (a-Si) 12 serving as a release layer is formed from a material gas composed of monosilane ($SiH_4$) by a CVD (chemical vapor deposition) method on a transparent glass substrate 11 which is a first substrate.

Peeling (referred to as "in-layer peeling" or "interfacial peeling") occurs in the layer or at the interface of the release layer due to application of light, e.g., laser light, as described below. Specifically, when a certain intensity of light is applied, interatomic or intermolecular binding force disappears or decreases with respect to atoms and molecules constituting the constituents, and ablation and the like occur so as to cause peeling. The application of the light may cause release of gases from the release layer and, thereby, separation may occur. There are cases where components contained in the release layer are vaporized and released so as to cause the separation and cases where the release layer is vaporized due to absorption of the light, and the resulting vapors are released so as to cause the separation. Amorphous silicon (a-Si) is suitable as a component of such a release layer, although not limited to this.

This amorphous silicon may contain hydrogen. The content of hydrogen may be at least about 2 atomic percent, and more preferably is 2 to 20 atomic percent. When hydrogen is contained, hydrogen is released by application of the light. Thereby, an internal pressure is generated in the release layer so as to accelerate the peeling. The content of hydrogen is adjusted by the film formation condition. For example, in the case where a CVD method is used, conditions, e.g., a gas composition, a gas pressure, a gas atmosphere, a gas flow rate, a gas temperature, a substrate temperature, and a power of the light input, are appropriately controlled. Next, as shown in FIG. 2(b), a thin film circuit layer including a thin film transistor (TFT), an electrode, and the like is formed. A silicon dioxide layer ($SiO_2$) 13 serving as a substrate insulating layer having a film thickness in the order of 300 nm is formed from material gases composed of monosilane ($SiH_4$) and oxygen ($O_2$) by a CVD method on the above-described amorphous silicon 12. A silicon layer 14 serving as a semiconductor layer is formed on the silicon dioxide layer 13 serving as a under layer. The silicon layer 14 can be formed from a material gas composed of monosilane ($SiH_4$) by a CVD method. The resulting silicon layer 14 is subjected to a heat treatment with an excimer laser or the like and, thereby, is allowed to polyciystallize. A polycrystalline silicon layer may be formed by a plasma CVD method. The resulting polycrystalline silicon layer 14 is patterned by a photoetching method so as to form an active region in which a thin film transistor is formed.

A silicon dioxide layer 15 serving as a gate insulating film is formed on the resulting silicon layer 14 by, for example, a thermal oxidation method or a PECVD method through the use of TEOS or the like as a material. A polycrystalline silicon layer containing a high concentration of impurities is formed thereon by the CVD method, and is patterned by the photoetching method so as to form a gate electrode and wiring 16. Alternatively, a metal thin film primarily containing aluminum, chromium, molybdenum, tantalum, or the like is formed by sputtering, and this is patterned, so that the gate electrode and wiring 16 can also be formed.

Impurities (for example, phosphorus ions) are implanted at a high concentration into a source-drain region of an N-type thin film transistor by an ion plantation method through the use of a resist, although not shown in the drawing, and the gate electrode 16 as masks. Likewise, impurities (for example, boron ions) are implanted at a high concentration into a source-drain region of a P-type thin film transistor by an ion plantation method through the use of the resist and the gate electrode 16 as masks. Thereafter, a heat treatment is performed, so that the impurities are activated. A silicon dioxide layer 17 is formed from material gases composed of monosilane (SiH$_4$) and oxygen (O$_2$) by the CVD method on the gate insulating film 15 and the gate electrode and wiring 16 so as to form an interlayer insulation film.

A contact hole is opened in the silicon oxide film 17 on the source-drain region of the thin film transistor by the photo-etching method. The region to be provided with a connection electrode is subjected to etching until the amorphous silicon layer 12 is exposed. A metal layer of aluminum or the like or a polycrystalline silicon layer doped with impurities is formed as a source-drain electrode, a wiring, and a connection electrode. Patterning is performed by the photoetching method and, thereby, a source-drain electrode and wiring 18 is formed.

As shown in FIG. 2(c), a silicon dioxide layer 19 is formed from material gases composed of monosilane (SiH$_4$) and oxygen (O$_2$) by the CVD method on the source-drain electrode and wiring 18 and the like so as to form a protective layer. The surface of the resulting protective layer 19 is flattened by polishing. The silicon dioxide layer 19 on the drain electrode is partially provided with an opening by the photoetching method. A transparent electrode layer made of ITO or the like is formed thereon, and is patterned by the photoetching method so as to form a lower electrode layer 31 of an organic EL light emitting element. A silicon dioxide layer 32 is formed thereon by the CVD method, and is provided with an opening at the portion corresponding to the lower electrode (ITO) 31 by the photoetching method. Furthermore, a photosensitive resin 33 is applied as a bank layer to separate pixel regions, and patterning exposure is performed to provide an opening at the portion corresponding to the lower electrode 31, followed by development, so as to provide an opening above the lower electrode 31. The photosensitive resin 33 in a cured state is used as a bank film material. The thin film circuit layer 20 is composed of layers from the substrate insulating layer 13 to the protective layer 19.

As shown in FIG. 3(a), an organic EL material is discharged from, for example, a droplet discharge head, not shown in the drawing, on the lower electrode 31, so as to form a coating film, and, thereby, a light emitting layer is provided. For example, a material for films of a hole transporting layer 34 and an EL light emitting layer 35 serving as light emitting layers is applied on the lower electrode 31 with the droplet discharge head so as to form films. A calcium layer 36, for example, is formed thereon as an electron transporting layer.

An aluminum layer 37 serving as a cathode is formed on the calcium layer 36 by a sputtering method, a vacuum evaporation method, or the like. A silicon nitride layer (Si$_x$N$_y$) 38 is formed thereon from material gases composed of monosilane (SiH$_4$) and ammonia (NH$_3$) by the CVD method in order to reduce or prevent permeation of gases and moisture into the calcium layer 36 and, therefore, a protective layer 38 is provided (FIG. 3(b)). The organic EL light emitting layer 30 is composed of layers from the lower electrode layer 31 to the protective layer 38.

The substrate 11 provided with the thin film circuits, e.g., the TFT circuit layer and the light emitting layer, is bonded together with a substrate 51 through an adhesive 41 (FIG. 3(c)). A plastic substrate, for example, can be used as the substrate 51. A water-resistant, gas-resistant curable resin is used as the adhesive 41, so that moisture and oxygen hardly pass through the adhesive 41. The substrate 51 and the adhesive 41 serve as a sealing substrate and a sealing agent, respectively.

Figure 4:
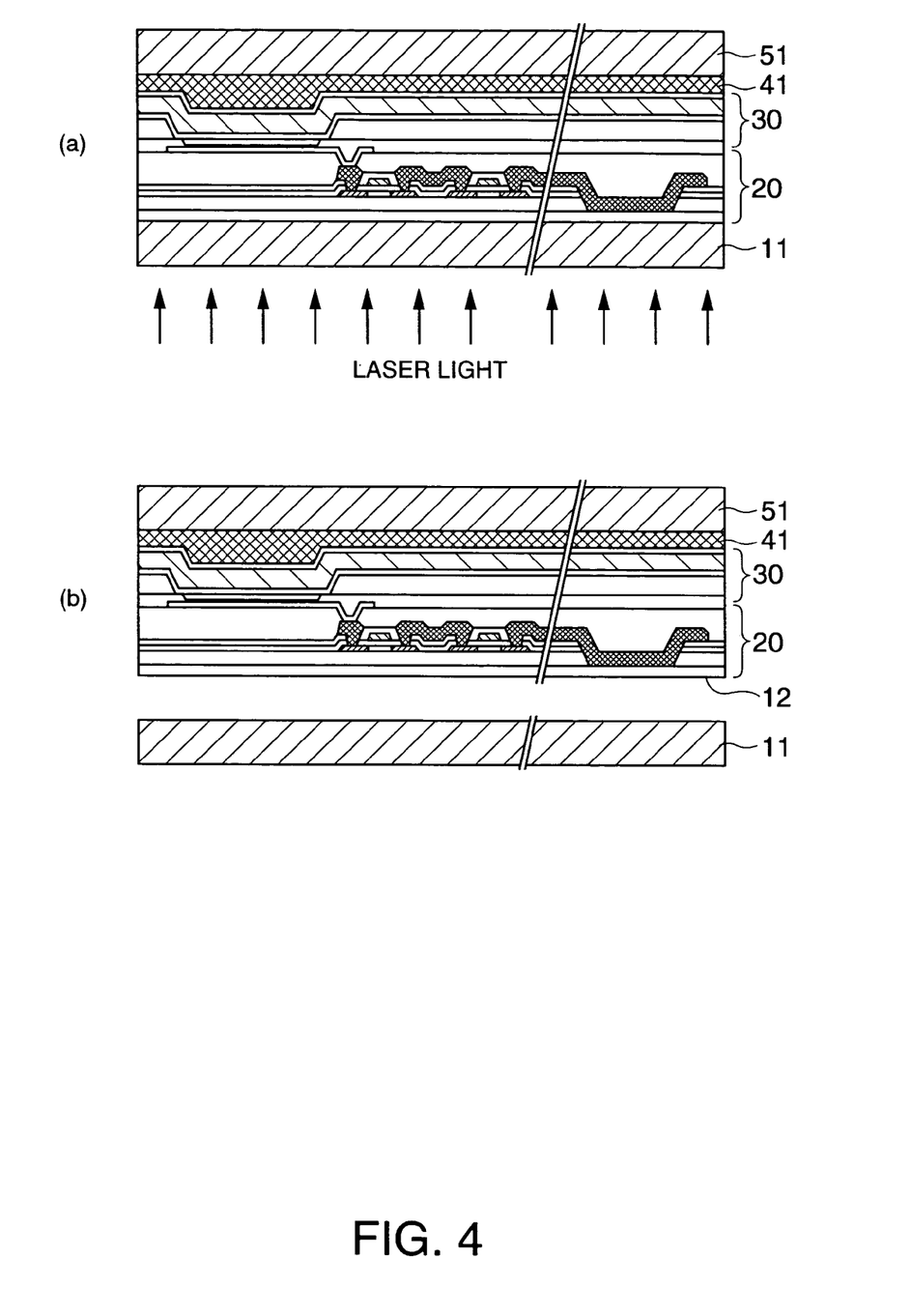
FIG. 4(a) and FIG. 4(b) are schematics for explaining the manufacturing process of the organic EL display device in the exemplary embodiment.

As shown in FIG. 4, the substrate 11 is peeled off. The amorphous silicon layer 12 serving as a release layer is irradiated with an excimer laser from the back side of the transparent substrate 11 so as to cause ablation or to vaporize and expand vaporizable components and, thereby, peeling is allowed to occur in the amorphous silicon layer 12 (in-layer peeling) or at the interface to the substrate 11 or at the interface to the substrate insulating layer 13 (interfacial peeling) (FIG. 4(a)).

The glass substrate 11 is peeled off along the release layer 12, and is separated. In this manner, the thin film circuit layer 30 is transferred (shifted) from the glass substrate 11 side to the temporary transfer substrate 33 side (FIG. 4(b)).

The substrate 11 may be removed by dissolution with, for example, a solution containing hydrofluoric acid, in place of the above. At that time, when an aqueous solution of hydrofluoric acid is used, the etching rate of the amorphous silicon layer 12, which is a constituent material of the release layer, is adequately small and, therefore, the advance of corrosion can be stopped after the substrate 11 is removed, while the release layer 12 is in the state of being exposed. Consequently, only the substrate 11 can be removed by dissolution while the TFT circuit layer is not eroded by the etching solution.

Figure 5:
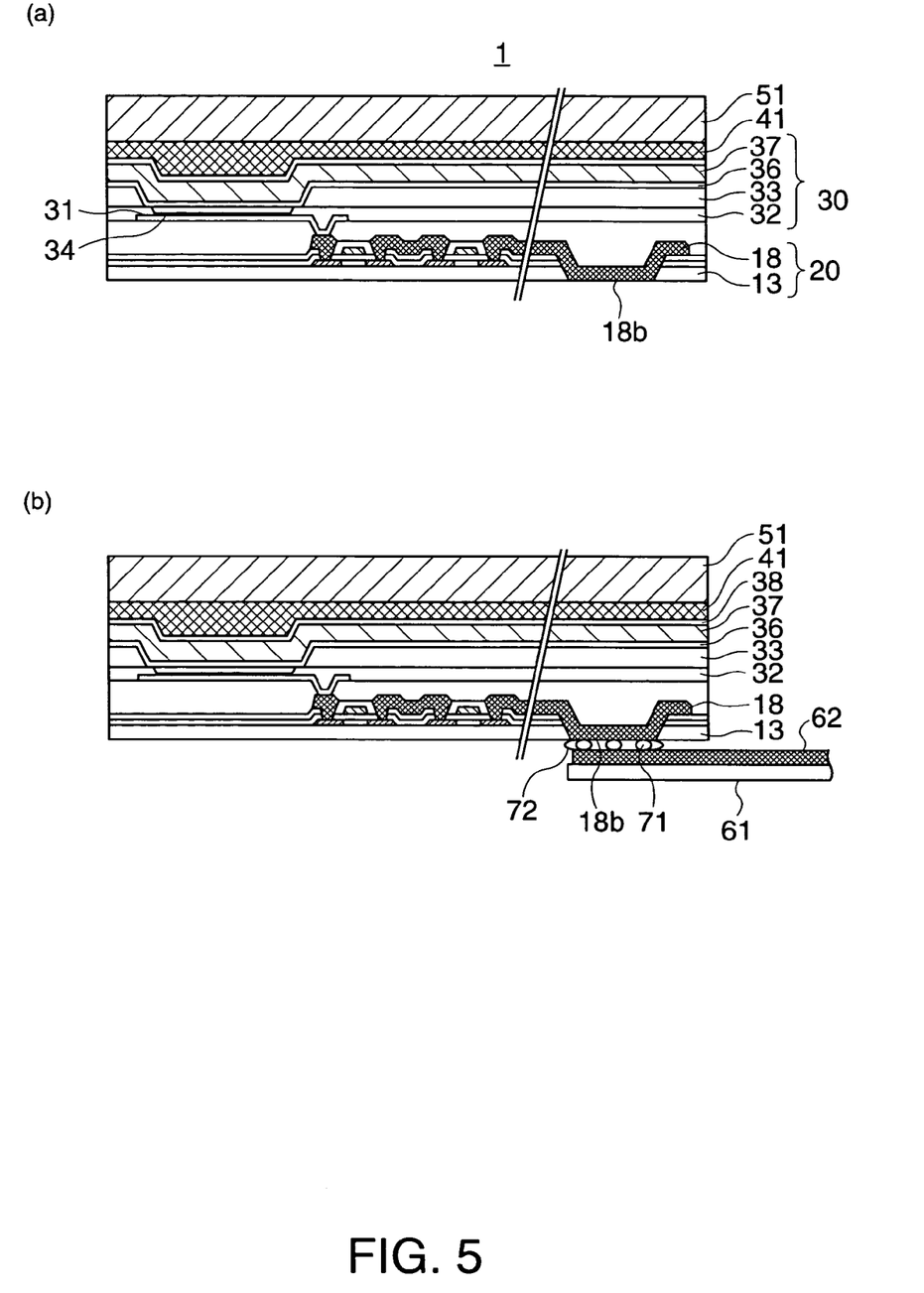
FIG. 5(a) and FIG. 5(b) are schematics for explaining the manufacturing process of the organic EL display device in the exemplary embodiment.

As shown in FIG. 5, the remaining release layer 12 left at the bottom portion of the thin film circuit layer 20 is removed by etching, so that a face-down type organic EL display device 1 which radiates the emitted light downward is formed (FIG. 5(a)).

The connection electrode 18b exposed at the bottom surface of the resulting organic EL display device 1 and a wiring 62 of an FPC substrate 61 connected to an external driving circuit and the like, although not shown in the drawing, are connected with an adhesive 72 through anisotropic conductive materials 71. The anisotropic conductive materials 71 have a property of conducting in the direction of compression. In this manner, the organic EL display device 1 is connected to external circuits, e.g., an image display circuit (FIG. 5(b)).

In the present exemplary embodiment, the target for the transfer is the laminate constituting the organic EL display device 1. However, in other thin film devices, the microstructure targeted for the transfer can be formed alone or together with the thin film circuit layer at this portion. As described above, microstructures include piezoelectric vibrators, electrostatic vibrators, actuators, diffraction gratings, micromirrors, microlenses, optical elements, probe structures of living body specimens and DNA specimens, and the like.

Figure 6:
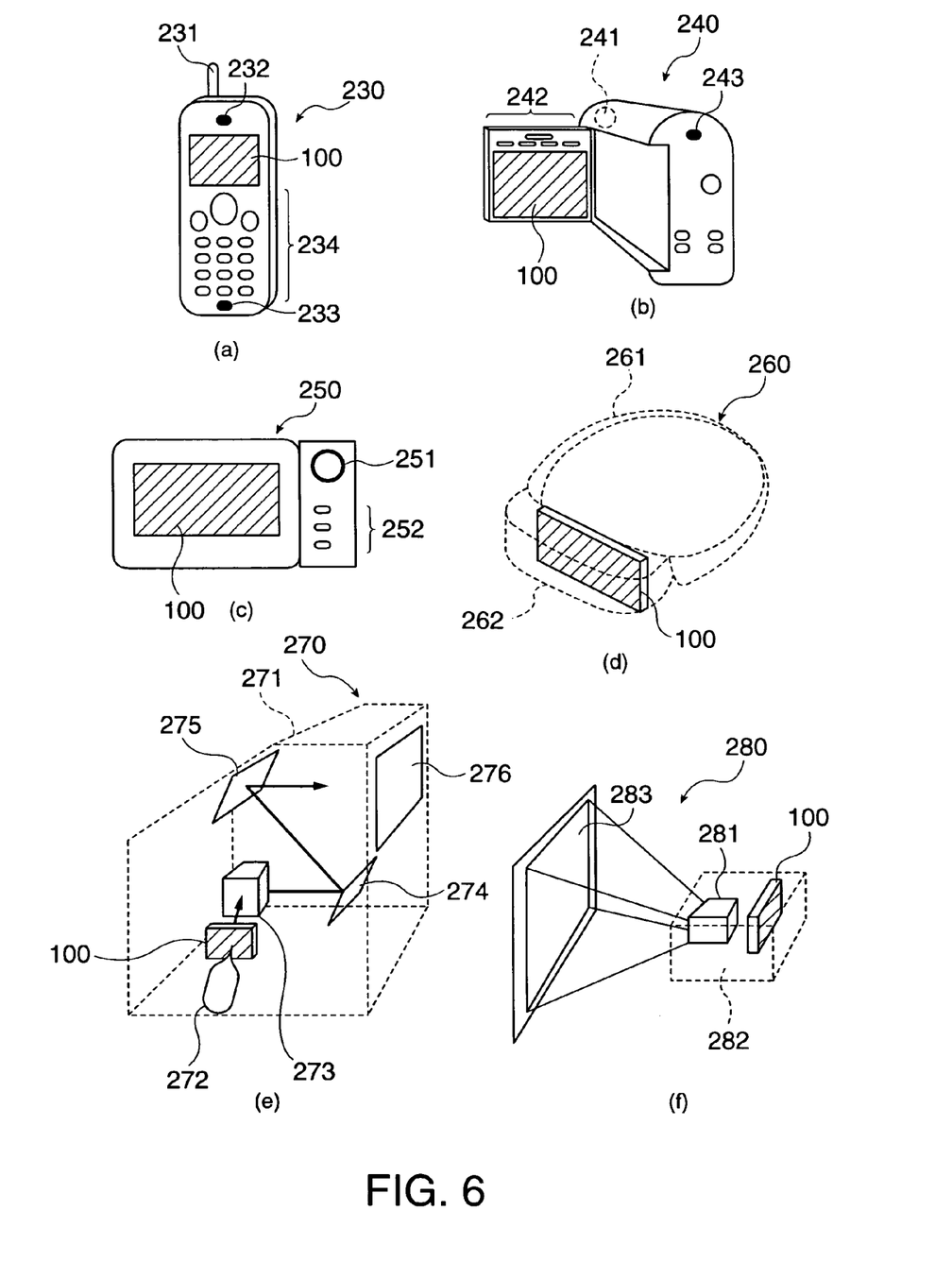
FIG. 6 is a schematic for explaining exemplary embodiments of electronic equipment including an organic EL display device.

FIG. 6 shows examples of electronic equipment including an organic EL display device which is an electro-optic device. FIG. 6(a) shows an example of application to a cellular phone. A cellular phone 230 is provided with an antenna portion 231, a voice output portion 232, a voice input portion 233, a control portion 234, and an organic EL display device 100. In this manner, the organic EL display device of an aspect of the present invention can be used as a display portion of the cellular phone 230. FIG. 6(b) shows an example of application to a video camera. A video camera 240 is provided with an image receiving portion 241, a control portion 242, a voice input portion 243, and an organic EL display device 100. In this manner, the organic EL display device of an aspect of the present invention can be used as a finder and a display portion. FIG. 6(c) shows an example of application to a portable personal computer. A computer 250 is provided with a camera portion 251, a control portion 252, and an organic EL display device 100. In this manner, the organic EL display device of an aspect of the present invention can be used as a display portion.

FIG. 6(d) shows an example of application to a head mount display. A head mount display 260 is provided with a band 261, an optical system storage portion 262, and an organic EL display device 100. In this manner, the organic EL display device of an aspect of the present invention can be used as an image display. FIG. 6(e) shows an example of application to a rear type projector. A projector 270 is provided with a light source 272, a synthetic optical system 273, a mirror 274, a mirror 275, a screen 276, and an organic EL display device 100 in a cabinet 271. In this manner, the organic EL display device of an aspect of the present invention can be used as an image display.

FIG. 6(f) shows an example of application to a front type projector. A projector 280 is provided with an optical system 281 and an organic EL display device 100 in a cabinet 282, and an image can be displayed on a screen 283. In this manner, the organic EL display device of an aspect of the present invention can be used as an image display.

The organic EL display device of an aspect of the present invention can be applied to various electronic equipment, not limited to the above-described examples. For example, the organic EL display device can also be used for facsimiles with a display function, finders of digital cameras, portable TVs, DSP devices, PDAs, electronic notepads, electric bulletin boards, advertisement displays, and the like.

As described above, according to an aspect of the present invention, the organic EL display device (or the display panel) is formed on one substrate and, therefore, a low-profile display device can be provided. Furthermore, the light is emitted from the side opposite to the substrate and, therefore, any loss due to the substrate can be avoided. Such an organic EL display device can be prepared through one pass of peeling transfer by the use of the peeling transfer method. According to the peeling transfer method, the above-described one substrate may be a plastic substrate.

What is claimed is:

1. An organic EL display device, comprising:
   a substrate;
   a laminate, the laminate including:
      an under layer provided with an opening;
      a thin film circuit layer provided on the under layer, the thin film circuit layer including an electric circuit, a gate insulating film and a substrate insulating layer;
      a wiring that couples the electric circuit to an external circuit through the opening, the wiring including a first section disposed over the under layer, the gate insulating film and the substrate insulating layer, and a second section that is provided within the opening, the first section and the second section being formed integrally from the same material, the second section defining a lower end of the wiring and being even with a lower surface of the under layer; and
      an organic EL light emitting layer provided directly on the thin film circuit layer; and
      an adhesive layer joining the substrate and the laminate.

2. The organic EL display device according to claim 1, film thickness of the under layer being out of 400 to 800 nm.

3. Electronic equipment, comprising:
   the organic EL display device according to claim 1 as a display portion.

4. A method for manufacturing an organic EL display device, comprising:
   forming a release layer on a first substrate;
   forming a laminate on the release layer, the forming of the laminate including:
      providing an under layer with an opening;
      providing a thin film circuit layer on the under layer, the thin film circuit layer including an electric circuit, a gate insulating film and a substrate insulating layer;
      providing a wiring that includes a first section disposed over the under layer, the gate insulating film and the substrate insulating layer, and a second section that is provided within the opening, the first section and the second section being formed integrally from the same material, the wiring being coupled to the electric circuit in the first section, the second section defining a lower end of the wiring and being even with a lower surface of the under layer; and
      providing an organic EL emitting layer directly on the thin film circuit layer, the organic EL light emitting layer emitting light toward the release layer side;
   joining the first substrate provided with the laminate and a second substrate with an adhesive layer therebetween; and
   applying energy via a laser to the release layer so as to cause peeling, and peeling off the first substrate so as to transfer the laminate to the second substrate side.

5. A method for manufacturing an organic EL display device, comprising:
   forming a release layer on a first substrate;
   forming a laminate on the release layer such that the laminate includes:
      an under layer provided with an opening,
      a thin film circuit layer provided on the under layer, the thin film circuit layer including an electric circuit, a gate insulating film and a substrate insulating layer,
      a wiring that couples the electric circuit to an external circuit through the opening, the wiring including a first section disposed over the under layer, the gate insulating film and the substrate insulating layer, and a second section that is provided within the opening, the first section and the second section being formed integrally from the same material, the second section defining a lower end of the wiring and being even with a lower surface of the under layer, and
      an organic EL light emitting layer provided directly on the thin film circuit layer, the organic EL light emitting layer emitting light toward the release layer side;
   joining the first substrate provided with the laminate and a second substrate with an adhesive layer therebetween; and
   removing the first substrate by dissolution, the dissolution being performed by hydrofluoric acid so as to transfer the laminate to the second substrate side.

6. The organic EL display device according to claim 1, the wiring further including an inclining section, the inclining section being integrally formed from the same material as the first section and the second section, the first section including a first part and a second part, the first part and the second part being in same plane and parallel to the second section, the first part and the second part being above the second section, the second section being between and separating the first part and the second part, each of the first part and the second part being connected to the second section by the inclining section.

7. The method for manufacturing the organic EL display device according to claim 4, the wiring further including an inclining section, the inclining section being integrally formed from the same material as the first section and the second section, the first section including a first part and a second part, the first part and the second part being in same plane and parallel to the second section, the first part and the second part being above the second section, the second section being between and separating the first part and the second part, each of the first part and the second part being connected to the second section by the inclining section.

8. The method for manufacturing the organic EL display device according to claim 5, the wiring further including an inclining section, the inclining section being integrally formed from the same material as the first section and the second section, the first section including a first part and a second part, the first part and the second part being in same plane and parallel to the second section, the first part and the second part being above the second section, the second section being between and separating the first part and the second part, each of the first part and the second part being connected to the second section by the inclining section.

* * * * *